United States Patent [19]
Chen

[11] Patent Number: 5,635,425
[45] Date of Patent: Jun. 3, 1997

[54] IN-SITU $N_2$ PLASMA TREATMENT FOR PE TEOS OXIDE DEPOSITION

[75] Inventor: Lai-Juh Chen, Hsin-chu, Taiwan

[73] Assignee: Industrial Technology Research Institute, Hsinchu, Taiwan

[21] Appl. No.: 450,296

[22] Filed: May 25, 1995

[51] Int. Cl.$^6$ .................... H01L 21/283; H01L 21/31
[52] U.S. Cl. .................... 438/631; 438/789; 438/763; 438/632
[58] Field of Search ................... 437/195, 228 ST, 437/231, 238, 241, 242; 257/760

[56] References Cited

U.S. PATENT DOCUMENTS

| | | | |
|---|---|---|---|
| 4,872,947 | 10/1989 | Wang et al. | 156/643 |
| 4,894,352 | 1/1990 | Lane et al. | 437/238 |
| 5,013,691 | 5/1991 | Lory et al. | 437/238 |
| 5,219,774 | 6/1993 | Vasché | 437/43 |
| 5,334,554 | 8/1994 | Lin et al. | 437/231 |
| 5,356,722 | 10/1994 | Nguyen et al. | 427/569 |

OTHER PUBLICATIONS

Wolf, S., Silicon Processing, vol. 2, 1990, Lattice Press, pp. 199–204, 224–236.

"Improvement of Gap–Filling Property of $O_3$–tetraethylorthosilicate (TEOS) Film by Ethanol Surface Treatment", Japan Journal of Applied Physics 32 (1993) Pt. 2 No. 1A/B pp. L110–L112.

Primary Examiner—T. N. Quach
Attorney, Agent, or Firm—George O. Saile; Rosemary L. S. Pike

[57] ABSTRACT

A method for avoiding separation between a TEOS layer and the underlying dielectric layer is described. A first dielectric layer is deposited over semiconductor device structures in and on a semiconductor substrate and planarized. A conducting layer is deposited overlying the first dielectric layer and patterned thereby exposing portions of the first dielectric layer. The exposed portions of the first dielectric layer are treated with $N_2$ plasma. A second dielectric layer is deposited overlying the patterned conducting layer and the exposed portions of the first dielectric layer. The treating of the exposed portions of the first dielectric layer with $N_2$ plasma improves adhesion between the second dielectric layer and the exposed portions of the first dielectric layer.

30 Claims, 7 Drawing Sheets

IN-SITU $N_2$ PLASMA TREATMENT FOR PE TEOS OXIDE DEPOSITION

BACKGROUND OF THE INVENTION (1) Field of the Invention

The present invention relates to the fabrication of integrated circuit devices, and more particularly, to a method of overcoming the separation problem between phosphosilicate glass and tetraethoxysilane (TEOS) oxide in the fabrication of integrated circuits.

(2) Description of the Prior Art

U.S. Pat. Nos. 4,872,947 to Wang and 5,219,774 to Vasche describe $O_3$-TEOS processes. U.S. Pat. No. 4,894,352 to Lane et al teaches the addition of $NF_3$ to TEOS deposition to increase the deposition rate. U.S. Pat. No. 5,013,691 to Lory et al teaches a TEOS deposition process using $NH_3$ or $NF_3$ gas to inhibit deposition, then removes the gas from horizontal surfaces using high radio frequency power so that horizontal TEOS deposition is favored.

Borophosphosilicate glass (BPSG) or phosphosilicate glass (PSG) is often used as an interlevel dielectric material. The BPSG or PSG is deposited over the underlayers and then flowed, typically at a temperature of about 900° C. for about 30 minutes in a $N_2$ ambient. This planarizes the surface of the substrate. It is proposed that during the flow treatment, outgassing from the BPSG or PSG layer occurs. For example, boron, phosphorus, carbon, and hydrogen gases are emitted from a BPSG layer during flow treatment. Referring now to FIG. 1, there is shown a semiconductor substrate 10 on which a layer of BPSG 12 has been deposited. A metal layer 14 is deposited and patterned. Impurities R form on the metal and BPSG surfaces, possibly due to outgassing caused by the BPSG flow process. These impurities can be, for example, $BPO_4$, $PO_3$, $B_2O_5$, etc. Because of the presence of the impurities R, the initial deposition of TEOS 18 is not stable, especially on the BPSG/TEOS interface. The actual TEOS deposition mechanism is not known. However, it is known that TEOS is hydrophobic as a gas molecule and prefers to deposit on hydrophobic surfaces, especially at atmospheric pressure. BPSG and PSG surfaces are hydrophillic; that is, there is more OH bonding. Therefore, it is reasonable to assume that TEOS molecules would be repelled from the BPSG or PSG surface during deposition. The hydrophobic property of TEOS is discussed by Sato et al in "Improvement of Gap-Filling Property of $O_3$-tetraethylorthosilicate (TEOS) Film by Ethanol Surface Treatment," Japan Journal of Applied Physics 32 (1993) Pt. 2 No. 1A/B pp. L110–L112.

An experiment was devised to simulate the separation problem. As shown in FIG. 2, a wafer was coated with BPSG which was flowed at 900° C. for 30 minutes in a $N_2$ ambient. A metal layer 14 of AlSiCu was sputter deposited over the BPSG layer 12 and patterned. The wafer was treated with isopropyl alcohol (IPA) to put impurities on the metal surface. The wafer was spin-coated with IPA, then the wafer was dried by baking in a 100° C. oven. In general, organic groups such as R—OH are formed as impurities on the metal surface.

Next, an atmospheric pressure TEOS oxide deposition 16 was performed using an $O_3$/TEOS feed ratio of 40:1 and deposition temperature of 400° C. to a film thickness of about 6000 Angstroms. During integrated circuit production, the film separation between the BPSG 12 and TEOS 16 layers would be found during reliability testing. In this experiment, the wafer was treated for 5 seconds in a HF containing stain solution. If the film interface is intrinsically weak, the interface will be attacked by the stain solution. The sample was examined by cross section under a scanning electron microscope (SEM). A separation was found between the BPSG 12 and the TEOS 16. It is desirable to find a method to avoid the separation problem between the BPSG and the TEOS layer.

SUMMARY OF THE INVENTION

Accordingly, it is a primary object of the invention to provide a process for avoiding the separation problem between a TEOS layer and the underlying dielectric layer in the fabrication of integrated circuits.

It is a further object to provide a process for avoiding separation between a TEOS layer and the underlying BPSG layer.

It is yet another object to provide a process for avoiding separation between a TEOS layer and the underlying PSG layer.

Yet another object is to provide a process for avoiding separation between a TEOS layer and the underlying spin-on-glass layer.

In accordance with the objects of the invention, a method for avoiding separation between a TEOS layer and the underlying dielectric layer is achieved. A first dielectric layer is deposited over semiconductor device structures in and on a semiconductor substrate and planarized. A conducting layer is deposited overlying the first dielectric layer and patterned thereby exposing portions of the first dielectric layer. The exposed portions of the first dielectric layer are treated with $N_2$ plasma. A second dielectric layer is deposited overlying the patterned conducting layer and the exposed portions of the first dielectric layer. The treating of the exposed portions of the first dielectric layer with $N_2$ plasma improves adhesion between the second dielectric layer and the exposed portions of the first dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
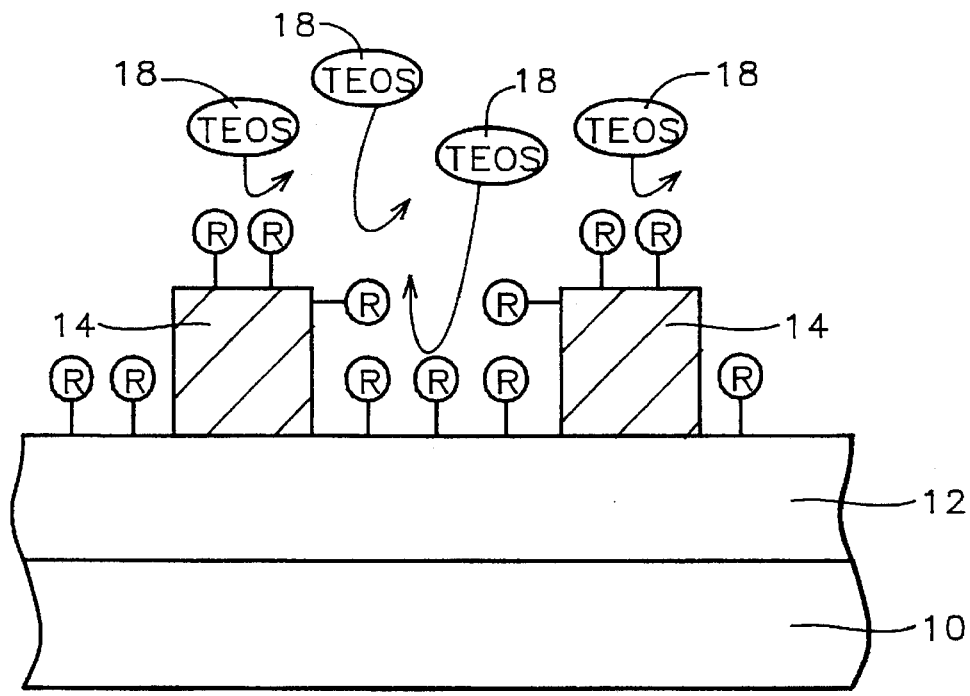
FIGS. 1 and 2 are cross-sectional representations of an integrated circuit showing the separation problem of the prior art.
Figure 2:
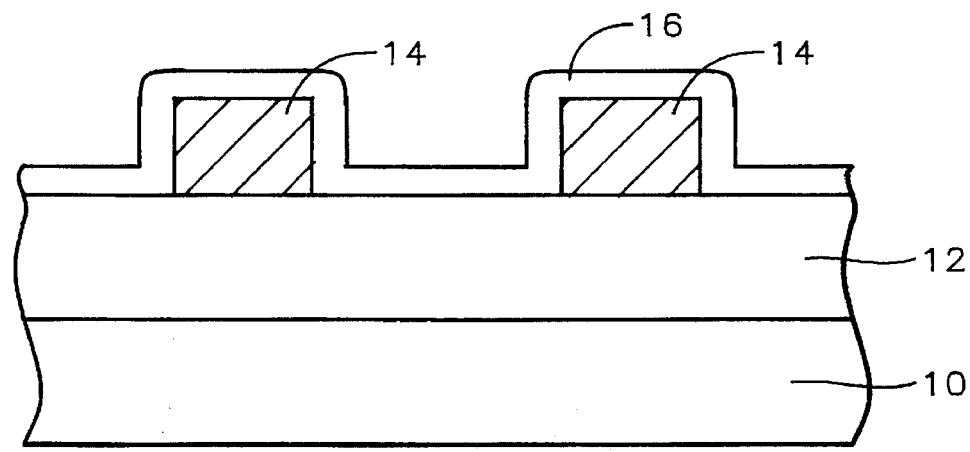
Figure 3:
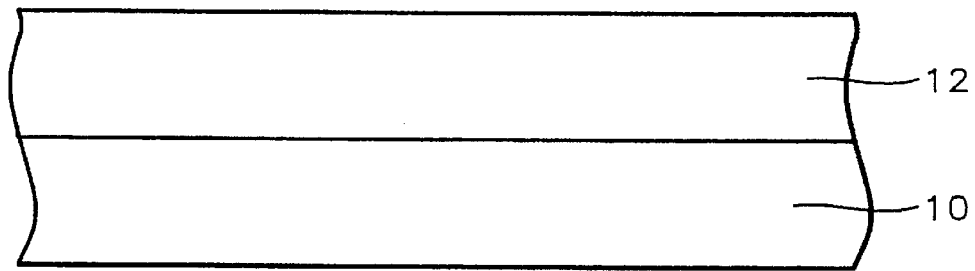
FIGS. 3, 4, 5A, 5B, 5C, and 6 are cross-sectional representations of a first preferred embodiment of the present invention.

Referring now more particularly to FIG. 3, there is shown a semiconductor substrate 10, in which may be formed semiconductor device structures which may include polysilicon gate electrodes and source and drain regions. A layer of BPSG or PSG 12 is deposited by atmospheric pressure chemical vapor deposition (APCVD) over the semiconductor device structures and flowed as is conventional at a temperature of between about 900° to 1100° C. for a duration of between about 30 to 60 minutes in a nitrogen or steam ambient to planarize the top surface of the substrate.

Figure 4:
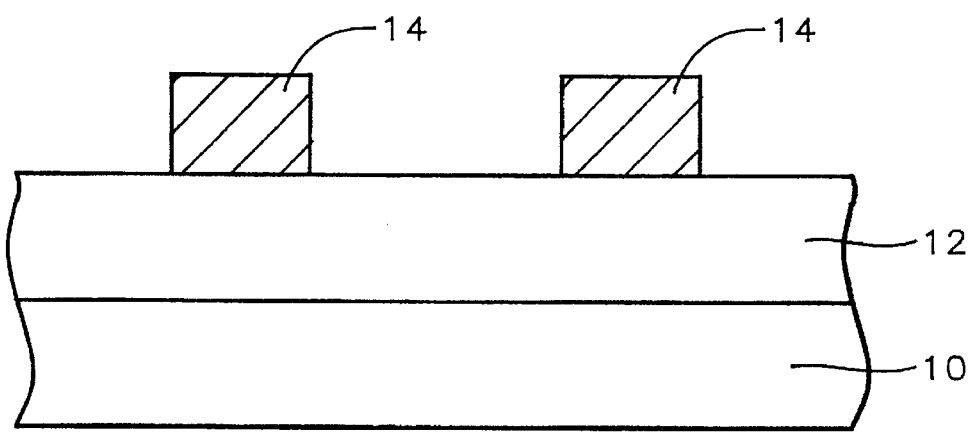

As described above, this reflow process may cause impurities, such as $P_2O_5$ and organic groups $OC_2H_5$ and $CH_3$, to be formed on the surface of the dielectric layer 12 by outgassing from the dielectric layer. A metal such as AlSiCu is deposited over the interlevel dielectric layer 12 and patterned, as illustrated by 14 in FIG. 4.

The conventional plasma enhanced TEOS chemical vapor deposition (PECVD) uses an $O_2$ flow rate of about 600 sccm and TEOS flow rate of about 800 sccm, temperature of between about 200° to 450° C., pressure of 1 to 50 Torr and power of between about 400 to 800 watts. During this intermetal dielectric deposition, the impurities formed during flow treatment will be elevated by the plasma deposition.

The novel TEOS deposition method of the present invention now will be described. In a first preferred embodiment of the invention, an in-situ $N_2$ treatment is provided. In the plasma enhanced process of the invention, $O_2$ is flowed at a rate of between about 200 to 600 sccm, TEOS is flowed at between about 600 to 1000 sccm, and $N_2$ is flowed at a rate of between about 200 to 400 sccm. The $N_2$ TEOS deposition is performed at a temperature of between about 350° to 450° C. under pressure of 7 to 9 Torr for a duration of between about 30 to 50 seconds. These parameters depend upon the thickness of TEOS to be deposited. The parameters given above will result in a TEOS film thickness of about 4500 Angstroms.

Figure 5A:
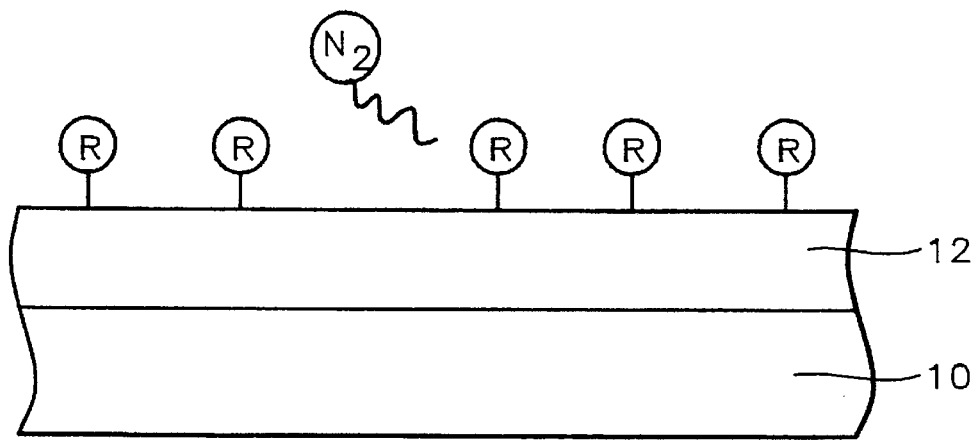
Figure 5B:
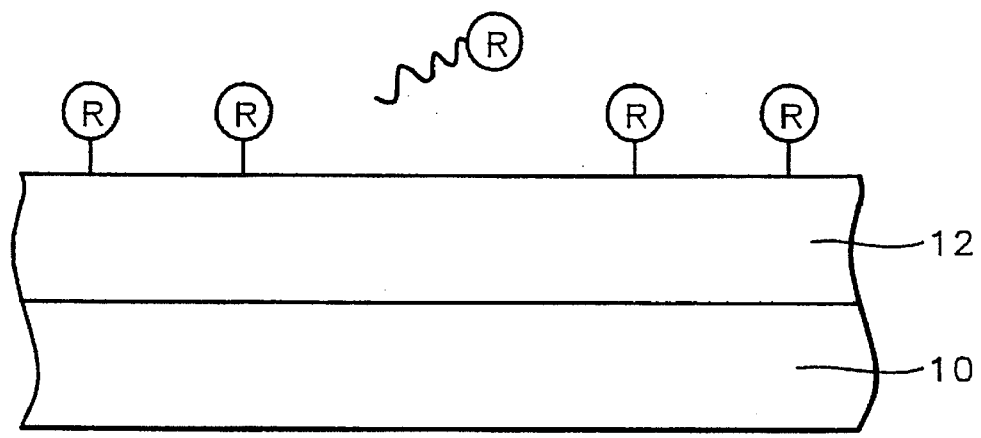
Figure 5C:
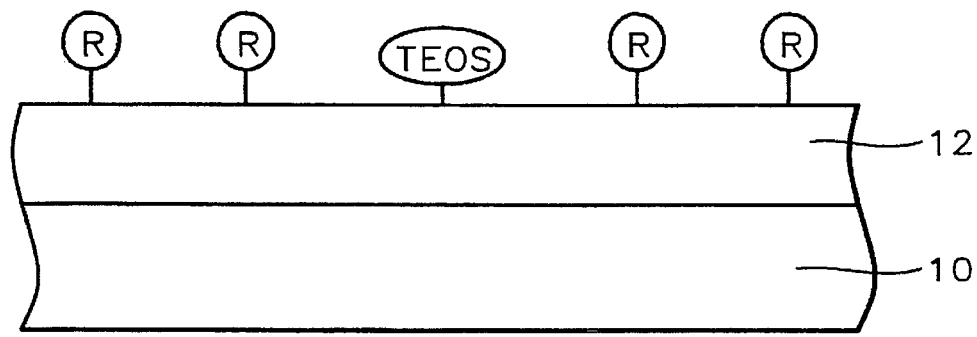

Referring to FIGS. 5A through 5C, a proposed mechanism for the $N_2$ plasma treatment as part of the PECVD TEOS deposition will be discussed. The impurities R, such as $BPO_4$, $PO_3$, $B_2O_5$, etc., on the surface of the BPSG layer 12 are illustrated in FIG. 5A. Impurities will also form on the metal layer, but not to the extent that they form on the BPSG layer. These impurities may be formed by outgassing during reflow of the BPSG or PSG layer 12 and will be enhanced during TEOS deposition. Nitrogen $N_2$ is a light molecule which moves faster than the TEOS molecule, and so reaches the BPSG or PSG surface first. The $N_2$ breaks the organic bond between the surface and the impurity R. The organic group R is desorbed from the surface as shown in FIG. 5B, making the surface more hydrophobic so that the TEOS molecule can now be deposited, as seen in FIG. 5C. The exact mechanism is not known and may not be precisely as described, but it has been shown that the process of the invention affords a stable adhesion of the TEOS layer to the BPSG or PSG surface.

Figure 6:
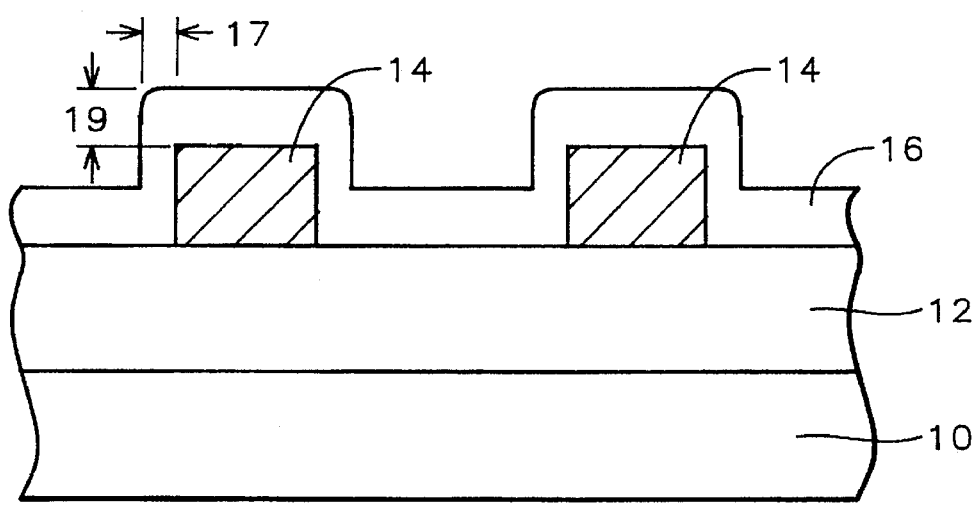

A second effect of the $N_2$ plasma TEOS process is an unexpected anisotropic TEOS deposition. As illustrated in FIG. 6, the TEOS layer 16 is deposited preferentially on the horizontal surfaces. The horizontal thickness 19 is much greater than the vertical sidewall thickness 17. This is both unexpected and highly desirable as narrow spaces should not be filled. This anisotropic deposition works for feature sizes as small as 0.35 microns without filling in narrow spaces between these features.

Figure 7A:
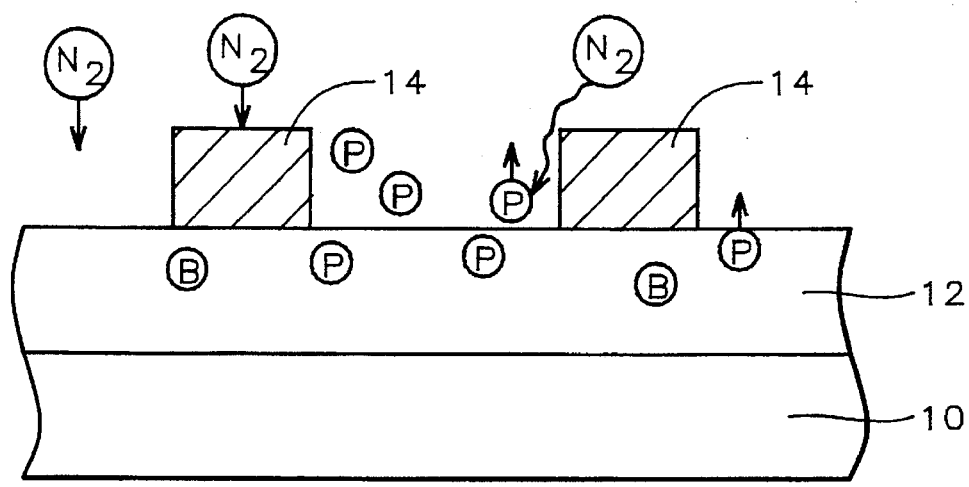
FIGS. 7A, 7B, and 8 are cross-sectional representations of a second preferred embodiment of the present invention.
Figure 7B:
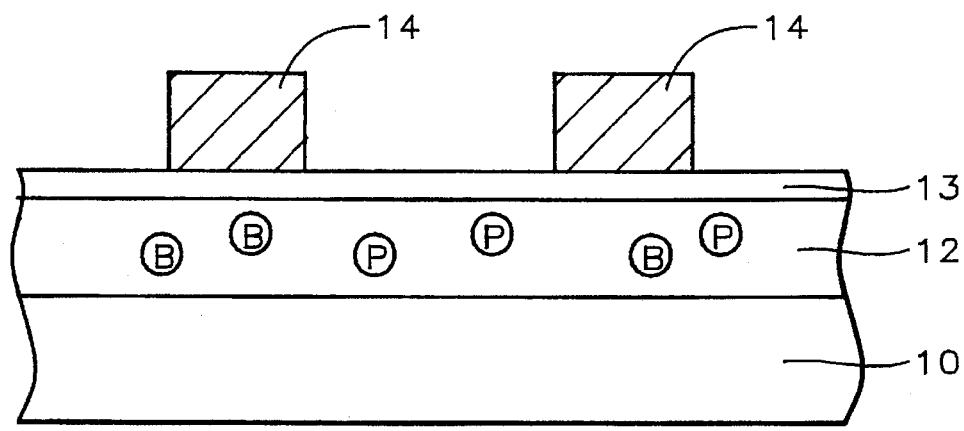

In a second preferred embodiment of the present invention, the $N_2$ plasma TEOS deposition is a sequential process. First, the wafer is exposed to $N_2$ plasma at a flow rate of 100 to 400 sccm and a temperature about 10° to 20° C. higher than that of the subsequent TEOS deposition. For example, if the TEOS deposition temperature is to be about 400° C., then the $N_2$ plasma treatment temperature should be between about 410° to 420° C. The pressure, power, and electrode spacing is the same for the $N_2$ plasma treatment as for the subsequent TEOS deposition. The higher temperature will force the impurities to diffuse toward the interface surface and the $N_2$ plasma will break the bonding of the impurities on the BPSG or PSG surface, as illustrated in FIG. 7A. This results in the formation of a depletion surface layer 13, illustrated in FIG. 7B. The depletion layer will prevent outgassing during TEOS deposition.

Figure 8:
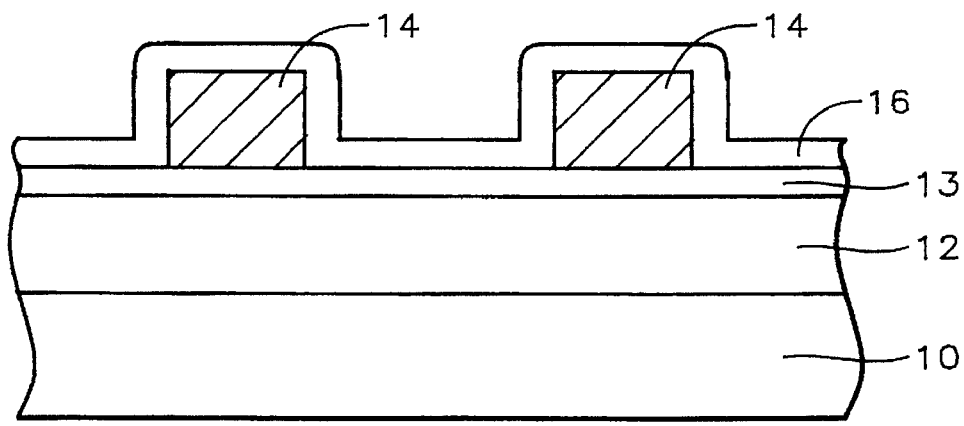

Next $TEOS/O_2$ is deposited by plasma enhanced chemical vapor deposition (PECVD) at a temperature 10° to 20° C. lower than the $N_2$ plasma treatment temperature, between about 350° to 450° C., resulting in a uniform thickness dielectric layer 16, as shown in FIG. 8.

Figure 9:
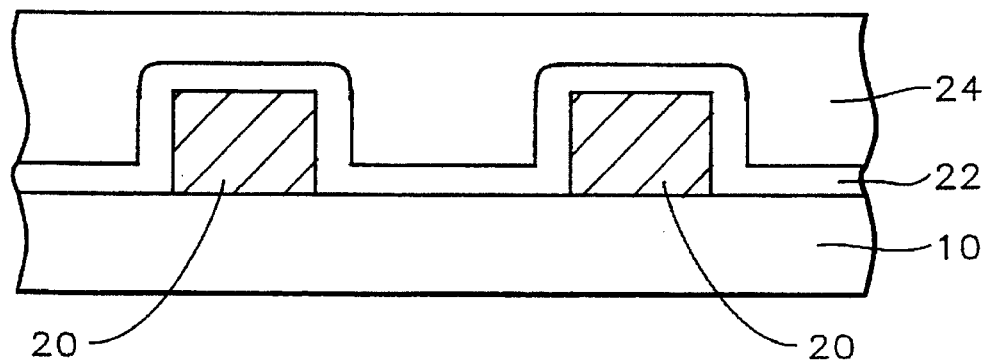
FIGS. 9, 10A and 10B are cross-sectional representations of a third preferred embodiment of the present invention.
Figure 10A:
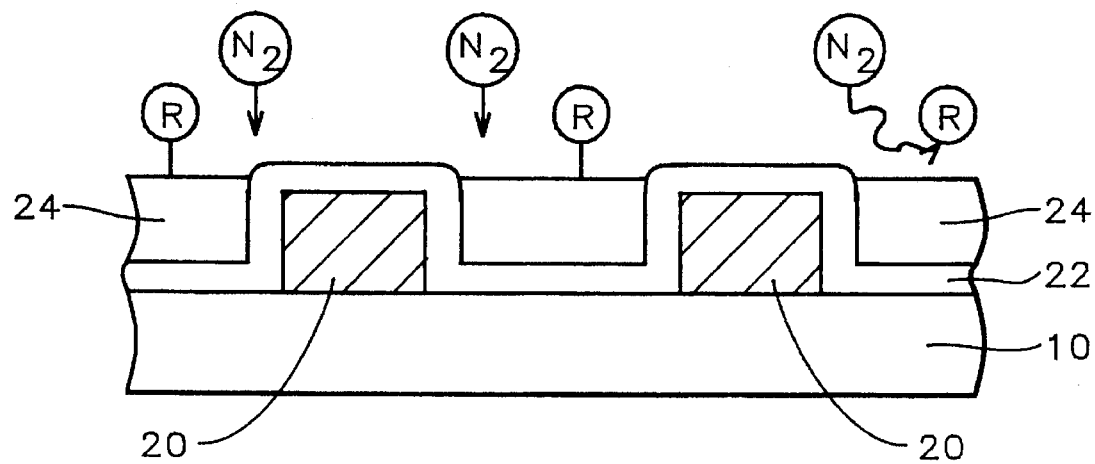
Figure 10B:
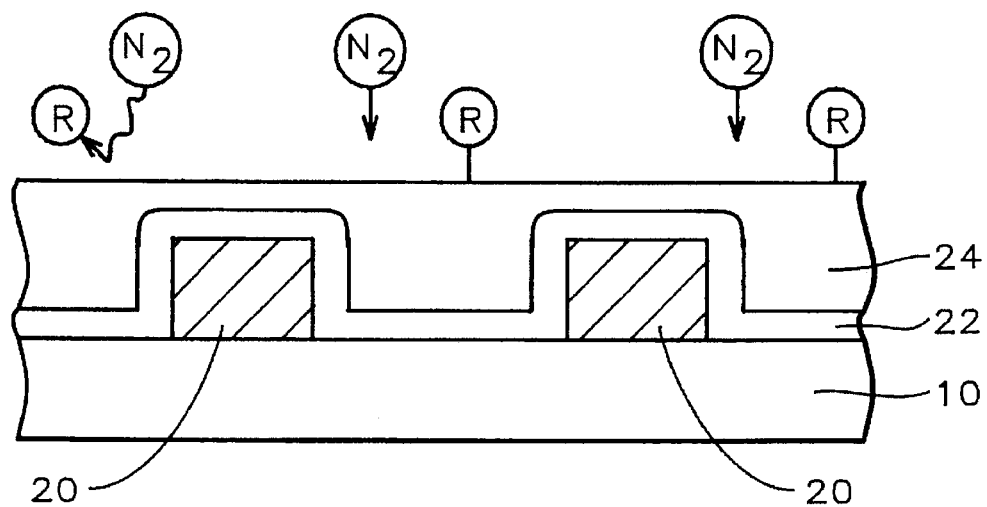

Referring now to FIGS. 9, 10A, and 10B, a third preferred embodiment of the present invention will be described. Referring now more particularly to FIG. 9, there is shown a semiconductor substrate 10, in which may be formed semiconductor device structures which may include polysilicon gate electrodes and source and drain regions. The top surface of the substrate may be planarized by a layer of BPSG or PSG or other material, not shown. A metal layer 20 has been deposited and patterned and is now to be planarized using a spin-on-glass material. First, a PECVD silicon oxide layer is deposited conformally over the metal layer. Next, the spin-on-glass material 24 is spin-coated onto the wafer surface as is conventional in the art. The spin-on-glass layer may be etched back to below the surface of the silicon oxide layer 22, as shown in FIG. 10A, or may be partially etched back as shown in FIG. 10B. Organic groups R will be formed on the surface of the spin-on-glass layer during etchback. An interface separation will occur between the spin-on-glass layer and subsequent PECVD TEOS dielectric layer if the R groups remain at the interface. The $N_2$ plasma treatment of the present invention will remove the organic groups from the surface of the spin-on-glass layer and permit a stable adhesion of the dielectric layer to the spin-on-glass layer.

The $N_2$ plasma treatment on spin-on-glass may be an in-situ $N_2$ plasma treatment and TEOS deposition, as described for the first embodiment, or it may be a sequential $N_2$ plasma treatment followed by TEOS deposition, as described for the second embodiment.

Figure 11:
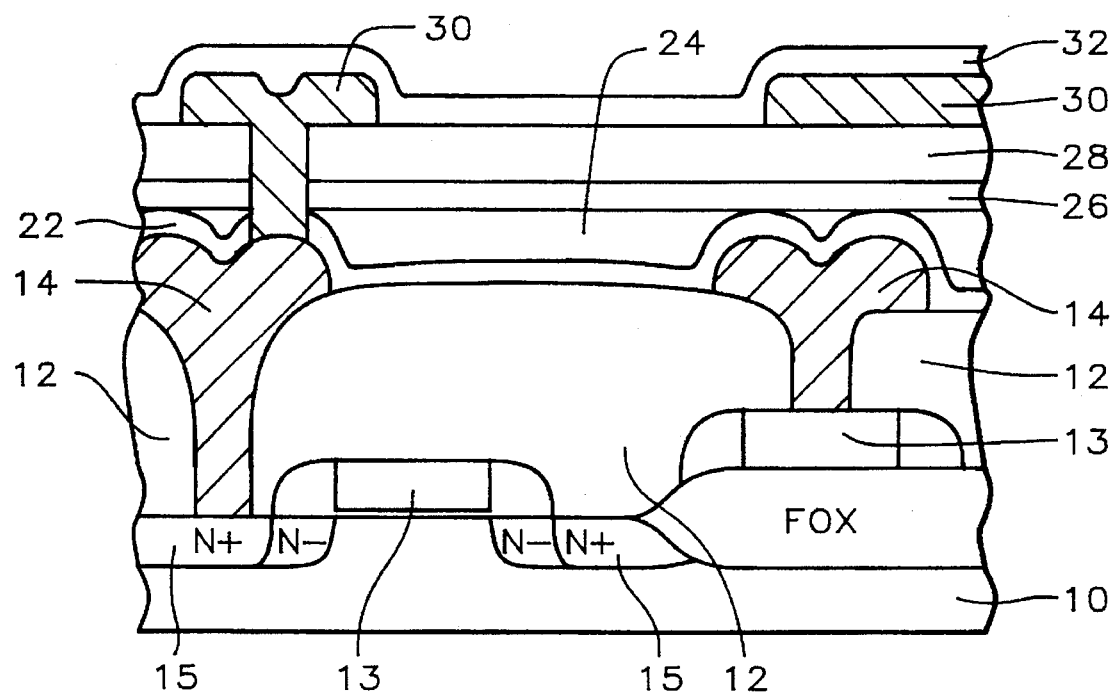
FIG. 11 is a cross-sectional representation of a completed integrated circuit of the present invention.

FIG. 11 illustrates a completed integrated circuit device according to the process of the present invention. Gate electrodes 13 and source and drain regions 15 are formed in and on a semiconductor substrate 10. BPSG layer 12 planarizes the substrate. Contact openings are made to the semiconductor device structures and metal layer 14 is deposited and patterned to complete the electrical connections. This metal layer is planarized, for example, using the spin-on-glass $N_2$ plasma treatment of the third embodiment of the present invention. First silicon oxide layer 22, spin-on-glass layer 24, and TEOS layer 26 are shown. According to the process of the invention, a stable adhesion is formed between the spin-on-glass layer 24 and the TEOS layer 26. A second BPSG layer 28 is deposited and flowed. Contact openings are made and a second metal layer 30 is deposited and patterned to complete the contacts. The TEOS layer 32 is deposited using the first or the second embodiment of the present invention, resulting in a stable adhesion of the TEOS layer 32 to the BPSG layer 30.

EXAMPLE

The following Example is given to show the important features of the invention and to aid in the understanding thereof. Variations may be made by one skilled in the art without departing from the spirit and scope of the invention.

The following test was performed to evaluate the process of the invention according to the first preferred embodiment, the in-situ $N_2$ plasma treatment and TEOS deposition. A BPSG film 4100 Angstroms thick was deposited on a semiconductor wafer. A layer of AlSiCu was sputter deposited over the BPSG layer and patterned. The in-situ $N_2$ plasma treatment and TEOS deposition was performed according to the following recipe:

Duration: 45 seconds
Power: 655 watts
Temp: 415° C.
$N_2$: 200 sccm
pressure: 8.5 Torr
$O_2$: 400 sccm
TEOS: 800 sccm The sample was stained using a HF-containing solution and compared to a sample prepared using a conventional TEOS deposition. According to examination under the scanning electron microscope, the TEOS layer of the conventional sample was attacked by the HF while the TEOS layer of the inventive sample was not.

While the invention has been particularly shown and described with reference to the preferred embodiments thereof, it will be understood by those skilled in the art that various changes in form and details may be made without departing from the spirit and scope of the invention.

What is claimed is:

1. A method of improving dielectric to dielectric adhesion in the manufacture of an integrated circuit comprising:

providing semiconductor device structures in and on a semiconductor substrate;

depositing a first dielectric layer overlying said semiconductor device structures and planarizing said first dielectric layer;

depositing a conducting layer overlying said first dielectric layer and patterning said conducting layer wherein portions of said first dielectric layer are exposed;

depositing a second dielectric layer overlying said patterned conducting layer and said exposed portions of said first dielectric layer wherein a simultaneous $N_2$ plasma treatment improves adhesion between said second dielectric layer and said exposed portions of said first dielectric layer; and completing the fabrication of said integrated circuit.

2. A method according to claim 1 wherein said first dielectric layer comprises borophosphosilicate glass.

3. A method according to claim 2 wherein said first dielectric layer is planarized by flowing said layer at a temperature of between about 900° to 1100° C. for a duration of between about 30 to 60 minutes.

4. A method according to claim 1 wherein said first dielectric layer comprises phosphosilicate glass.

5. A method according to claim 4 wherein said first dielectric layer is planarized by flowing said layer at a temperature of between about 900° to 1100° C. for a duration of between about 30 to 60 minutes.

6. A method according to claim 1 wherein said first dielectric layer comprises spin-on-glass.

7. A method according to claim 6 wherein said first dielectric layer is planarized by etching back said first dielectric layer.

8. A method according to claim 1 wherein said planarizing of said first dielectric layer produces impurities on the surface of said first dielectric layer and wherein said impurities impede adhesion between said first and second dielectric layers.

9. A method according to claim 8 wherein said impurities are removed by said simultaneous $N_2$ plasma treatment.

10. A method according to claim 1 wherein said second dielectric layer is deposited by flowing $O_2$ at the rate of 200 to 600 sccm, TEOS at the rate of 600 to 1000 sccm, and $N_2$ at the rate of 200 to 400 sccm at a temperature of between about 350° to 450° C. under pressure of between about 7 to 9 Torr for a duration of between about 30 to 50 seconds.

11. A method according to claim 10 wherein said second dielectric layer is deposited anisotropically whereby the thickness of said second dielectric layer is relatively greater on the horizontal surfaces of said patterned conducting layer and said exposed portions of said first dielectric layer than it is on the vertical surfaces of said patterned conducting layer.

12. A method of improving dielectric to dielectric adhesion in the manufacture of an integrated circuit comprising:

providing semiconductor device structures in and on a semiconductor substrate;

depositing a first dielectric layer overlying said semiconductor device structures and planarizing said first dielectric layer wherein said planarizing produces impurities on the surface of said first dielectric layer and wherein said impurities impede adhesion between said first dielectric layer and a second dielectric layer;

depositing a conducting layer overlying said first dielectric layer and patterning said conducting layer wherein portions of said first dielectric layer are exposed;

depositing said second dielectric layer overlying said patterned conducting layer and said exposed portions of said first dielectric layer wherein a simultaneous $N_2$ plasma treatment removes said impurities and consequently improves said adhesion between said second dielectric layer and said exposed portions of said first dielectric layer and wherein said second dielectric layer is deposited anisotropically whereby the thickness of said second dielectric layer is relatively greater on the horizontal surfaces of said patterned conducting layer and said exposed portions of said first dielectric layer than it is on the vertical surfaces of said patterned conducting layer; and completing the fabrication of said integrated circuit.

13. The method of claim 12 wherein said first dielectric layer comprises borophosphosilicate glass.

14. The method of claim 13 wherein said first dielectric layer is planarized by flowing said layer at a temperature of between about 900° to 1100° C. for a duration of between about 30 to 60 minutes.

15. The method of claim 12 wherein said first dielectric layer comprises phosphosilicate glass.

16. The method of claim 15 wherein said first dielectric layer is planarized by flowing said layer at a temperature of between about 900° to 1100° C. for a duration of between about 30 to 60 minutes.

17. A method according to claim 12 wherein said first dielectric layer comprises spin-on-glass.

18. A method according to claim 17 wherein said first dielectric layer is planarized by etching back said first dielectric layer.

19. A method according to claim 12 wherein said second dielectric layer is deposited by flowing $O_2$ at the rate of 200 to 600 sccm, TEOS at the rate of 600 to 1000 sccm, and $N_2$ at the rate of 200 to 400 sccm at a temperature of between about 350° to 450° C. under pressure of between about 7 to 9 Torr for a duration of between about 30 to 50 seconds.

20. A method of improving dielectric to dielectric adhesion in the manufacture of an integrated circuit comprising:

providing semiconductor device structures in and on a semiconductor substrate;

depositing a first dielectric layer overlying said semiconductor device structures and planarizing said first dielectric layer;

depositing a conducting layer overlying said first dielectric layer and patterning said conducting layer wherein portions of said first dielectric layer are exposed;

treating said exposed portions of said first dielectric layer with $N_2$ plasma thereby forming a depletion surface layer in said first dielectric layer wherein said treating with said $N_2$ plasma is performed at a temperature of between about 350° to 450° C.;

thereafter depositing a second dielectric layer overlying said patterned conducting layer and said exposed portions of said first dielectric layer at a temperature of between about 350° to 450° C. wherein said temperature is 10° to 20° C. lower than previous said treating with said $N_2$ plasma and wherein said treating with said $N_2$ plasma and said depletion layer improve adhesion between said second dielectric layer and said exposed portions of said first dielectric layer; and completing the fabrication of said integrated circuit.

21. A method according to claim 20 wherein said first dielectric layer comprises borophosphosilicate glass.

22. A method according to claim 21 wherein said first dielectric layer is planarized by flowing said layer at a temperature of between about 900° to 1100° C. for a duration of between about 30 to 60 minutes.

23. A method according to claim 20 wherein said first dielectric layer comprises phosphosilicate glass.

24. A method according to claim 23 wherein said first dielectric layer is planarized by flowing said layer at a temperature of between about 900° to 1100° C. for a duration of between about 30 to 60 minutes.

25. A method according to claim 20 wherein said first dielectric layer comprises spin-on-glass.

26. A method according to claim 25 wherein said first dielectric layer is planarized by etching back said first dielectric layer.

27. A method according to claim 20 wherein said planarizing of said first dielectric layer produces impurities on the surface of said first dielectric layer and wherein said impurities impede adhesion between said first and second dielectric layers.

28. A method according to claim 20 wherein said impurities are removed by said treating of said exposed portions of said first dielectric layer with $N_2$ plasma.

29. A method according to claim 20 wherein said treating with $N_2$ plasma comprises flowing said $N_2$ plasma at a rate of between about 100 to 400 sccm at a temperature of between about 10° to 20° C. greater than the temperature of subsequent depositing of said second dielectric layer.

30. A method according to claim 20 wherein said second dielectric layer is deposited by flowing $O_2$ at the rate of 200 to 600 sccm and TEOS at the rate of 600 to 1000 sccm under pressure of between about 7 to 9 Torr for a duration of between about 30 to 50 seconds.

* * * * *